United States Patent [19]

Tsuda et al.

[11] Patent Number: 5,266,818
[45] Date of Patent: Nov. 30, 1993

[54] COMPOUND SEMICONDUCTOR DEVICE HAVING AN EMITTER CONTACT STRUCTURE INCLUDING AN $In_xGa_{1-x}As$ GRADED-COMPOSITION LAYER

[75] Inventors: Kunio Tsuda; Kouhei Morizuka, both of Yokohama, Japan

[73] Assignee: Kabushiki Kaisha Toshiba, Kawasaki, Japan

[21] Appl. No.: 852,334

[22] Filed: Mar. 17, 1992

Related U.S. Application Data

[63] Continuation of Ser. No. 617,175, Nov. 23, 1990, abandoned.

[30] Foreign Application Priority Data

Nov. 27, 1989 [JP] Japan .................................. 1-306791
Jan. 18, 1990 [JP] Japan ...................................... 2-9028

[51] Int. Cl.$^5$ .......................................... H01L 29/161
[52] U.S. Cl. .................................. 257/191; 257/197; 257/587; 257/655; 257/745
[58] Field of Search ................... 357/65, 67, 71, 22 A, 357/34, 34 HB, 16, 4; 257/197, 198, 191, 587, 655, 745

[56] References Cited

U.S. PATENT DOCUMENTS

| | | | |
|---|---|---|---|
| 4,075,651 | 2/1978 | James | 357/22 A |
| 4,801,984 | 1/1989 | Woodall | 357/16 |
| 4,961,194 | 10/1990 | Kuroda et al. | 357/65 |
| 5,001,534 | 3/1991 | Lunardi et al. | 357/16 |

OTHER PUBLICATIONS

Ramberg et al., "Lattice-Strained Heterojunction InGaAs/GaAs Bipolar Structures: Recombination Properties and Device Performance", *Journal of Applied Physics*, 61(3), Feb. 1987, pp. 1234-1236.
Nagata et al., "Self-Aligned AlGaAs/GaAs HBT with Low Emitter Resistance Utilizing InGaAs Cap Layer," *IEEE Transactions on Electron Devices*, vol. ED-35, No. 1, Jan. 1988, pp. 2-7.
J. M. Woodall et al., "Ohmic Contacts to n-GaAs Using Graded Band Gap Layers of $Ga_{1-x}In_xAs$ Grown by Molecular Beam Epitaxy", Journal of Vacuum Science Technology vol. 19, No. 3, Sep./Oct. 1981, pp. 626-627.
T. Nittono et al., "Non-Alloyed Ohmic Contacts to n-GaAs Using Compositionally Graded $In_xGa_{1-x}As$ Layers", Japanese Journal of Applied Physics, vol. 27, No. 9, Sep. 1988, pp. 1718-1722.
N. Hayama et al., "A Low-Noise Ku-Band AlGaAs/GaAs HBT Oscillator", 1988 IEEE MTT International Microwave Symposium Digest, vol. 2, May 25-27, 1988, pp. 679-682.
T. Nittono et al., "A New Self-Aligned AlGaAs/GaAs HBT Based on Refractory Emitter and Base Electrodes", IEEE Electron Device Letters vol. 10, No. 11, Nov. 1989, pp. 506-507.
S. Kuroda et al., "A New Fabrication Technology for AlGaAs/GaAs HEMT LSI's Using InGaAs Nonalloyed Ohmic Contacts", IEEE Transactions on Electron Devices, vol. 36, No. 10, Oct. 1989, pp. 2196-2203.
C. H. Yang et al., "Implant and Annealed Ohmic Contact to a Thin Quantum Well", Applied Physics Letters, vol. 55, No. 16, Oct. 16, 1989, pp. 1650-1652.
S. Kuroda et al., "HEMT VLSI Technology Using Nonalloyed Ohmic Contacts", International Electron Devices Meeting Technical Digest 1988, Dec. 11-14, 1988, pp. 680-683.

*Primary Examiner*—Andrew J. James
*Assistant Examiner*—Courtney A. Bowers
*Attorney, Agent, or Firm*—Finnegan, Henderson, Farabow, Garrett & Dunner

[57] ABSTRACT

A compound semiconductor device wherein a contact to an n type $Al_xGa_{1-x}As$ layer comprises an $In_xGa_{1-x}As$ graded-composition layer, an $In_xGa_{1-x}As$ contact layer having a constant composition and a metal electrode layer, the $In_xGa_{1-x}As$ graded-composition layer is doped with an n type impurity which concentration is higher than a concentration of an impurity activated as n type, whereby, even when a thickness of the $In_xGa_{1-x}As$ graded-composition layer is made sufficiently small, a reduction in the carrier concentration of the thin graded-composition layer causes no increase of its resistance and a low-resistance contact is realized.

8 Claims, 3 Drawing Sheets

COMPOUND SEMICONDUCTOR DEVICE HAVING AN EMITTER CONTACT STRUCTURE INCLUDING AN $In_xGa_{1-x}As$ GRADED-COMPOSITION LAYER

This application is a continuation of application Ser. No. 07/617,175 filed Nov. 23, 1990, now abandoned.

BACKGROUND OF THE INVENTION

1. Field of the Invention

The present invention relates to compound semiconductor devices and more particularly, to formation of a contact to an n type $Al_xGa_{1-x}As$ ($0 \leq X \leq 1$) material.

2. Description of the Related Art

GaAs has been considered to offer a very promising prospect as a material for a high speed device, because the material has a mobility of about 6 times larger than that of silicon (Si) and can be easily made into a semi-insulating substrate.

$Al_xGa_{1-x}As$ obtained by adding aluminum (Al) to GaAs is very close in lattice constant to GaAs and allows good epitaxial growth with GaAs. For this reason, attention has been increasingly directed to development of heterojunction devices based on an $Al_xGa_{1-x}As$/GaAs heterojunction.

As a result, many sorts of devices have been developed, including, for example, an $Al_xGa_{1-x}As$/GaAs heterojunction bipolar transistor (HBT) having a wide gap emitter of $Al_xGa_{1-x}As$, and a high electron mobility transistor (HEMT) having an electron supply layer of $Al_xGa_{1-x}As$.

For the purpose of enhancing the performances of these devices, it is very important to reduce the resistance of their ohmic contact.

Generally speaking, it is difficult to form an ohmic contact of low resistance on an $Al_xGa_{1-x}As$ layer ($0 < X \leq 1$). For this reason, even when such an $Al_xGa_{1-x}As$ layer must be placed as the top layer of a device, an n+ type GaAs layer has been formed on the $Al_xGa_{1-x}As$ layer as a cap layer for the ohmic contact. To this end, the composition of metal material of its electrodes, the temperature of heat treatment for the formation of the alloy, etc., have been correspondingly devised.

Since these GaAs and $Al_xGa_{1-x}As$ materials are large in band gap and low in the upper limit of obtained electron concentration when compared with Si material, the reduction of the ohmic contact resistance is limited thereby.

To overcome this, there has been proposed a method of using $In_xGa_{1-x}As$ material having a band gap smaller than the $Al_xGa_{1-x}As$ or GaAs as a contact layer (refer to J. Vac. Sci. Technol., 19 (3), 1981, pp626–627).

FIG. 5 shows, as one of such prior art examples, an ideal energy band between an n type GaAs layer and a metallic electrode with an n+ type $In_xGa_{1-x}As$ layer and an n+ InAs layer interposed therebetween at the time of forming a contact to the n type GaAs. For the purpose of smoothly connecting together the bands of the GaAs and InAs layers, the graded-composition layer of the $In_xGa_{1-x}As$ material (x=0→1) is inserted between the GaAs and InAs layers. Since no Schottky barrier is present between the InAs layer and the electrode, a low resistance contact can be obtained.

However, there is a lattice misalignment as large as about 7% between the InAs and GaAs layers.

This lattice misalignment causes the InGaAs layer to be subjected to a misfit dislocation. In the event where the thickness of the InGaAs layer is below its critical thickness, no misfit dislocation takes place. When it is desired to form an ohmic contact of lower resistance, however, it is preferable that an In mixed crystal ratio x is closer to 1 and the critical thickness becomes correspondingly smaller. When the InGaAs layer has a mixed crystal ratio x of 0.5, its critical thickness is below several ten Å. In addition, as the mixed crystal ratio x is closer to 1, the thickness of the $In_xGa_{1-x}As$ graded-composition layer necessary for smoothly connecting the bands of the InAs and GaAs layers is larger. Meanwhile, when the element performance, process, etc., are taken into consideration, it is preferable to make small the thickness of the contact layer. From these reasons, when an ohmic contact of low resistance is to be formed with use of a practical structure, the occurrence of a misfit dislocation cannot be avoided.

Furthermore, the occurrence of such a misfit dislocation is concentrated, in particular, in the $In_xGa_{1-x}As$ as an intermediate layer to compensate for the carriers in this area, which involves a problem that the carrier concentration is reduced.

It is known that the upper limit of the usual carrier concentration, which depends on the epitaxial growth conditions and so on, is about $2 \times 10^{19} cm^{-3}$ and about $1 \times 10^{19} cm^{-3}$ for InAs and GaAs respectively. In the case of the InAs/$In_xGa_{1-x}As$/GaAs structure, a large carrier concentration dip occurs, in particular, in the intermediate layer of $In_xGa_{1-x}As$. When the thickness of the $In_xGa_{1-x}As$ is made sufficiently large, the dislocation density ($cm^{-3}$) is also reduced and the carrier concentration dip is correspondingly decreased.

When consideration is paid to the application of such a structure to a semiconductor device having an n type ohmic contact, however, it is not practical to increase the layer thickness.

Turning now to FIG. 6, there is shown a measurement result of carrier concentration distribution in the InAs/$In_xGa_{1-x}As$/GaAs structure doped with silicon. In the drawing, the film thickness of the $In_xGa_{1-x}As$ layer was set to be 500Å and $1.5 \times 10^{19} cm^{-3}$ of silicon was doped into the InAs and $In_xGa_{1-x}As$. As will be seen from the drawing, the carrier concentration largely drops in the $In_xGa_{1-x}As$ layer and there is an area therein where the carrier concentration is substantially zero especially in the vicinity of the interface with the GaAs layer. Under such a condition, the contact resistance when a current x flows in a vertical direction with respect to the semiconductor layer was as high as $5 \times 10^{-6} \Omega\ cm^2$.

Thus, the conventional structure has had such a problem that, even when a low-resistance contact can be obtained at the InAs/electrode interface, it is impossible for the entire contact to have a sufficiently low resistance.

In this way, the conventional method of forming the ohmic contact to the n type GaAs layer using the $In_xGa_{1-x}As$ layer has had a problem that the carrier compensation caused by the misfit dislocation causes the reduction of the carrier concentration, which results in that an area having a high resistance is formed and the contact resistance becomes correspondingly large.

SUMMARY OF THE INVENTION

In view of the above circumstances, it is an object of the present invention to realize an ohmic contact having a very low resistance, which can avoid such a problem in the prior art that, at the time of forming an ohmic contact to an n type GaAs layer using an $In_xGa_{1-x}As$ layer, reduction in the carrier concentration of the $In_xGa_{1-x}As$ graded-composition layer causes formation of a high-resistance layer.

According to the present invention, in forming a metal electrode layer on an n type $Al_xGa_{1-x}As$ layer via an $In_xGa_{1-x}As$ graded-composition layer and an $In_xGa_{1-x}As$ contact layer having a constant composition, the $In_xGa_{1-x}As$ graded-composition layer doped with an n type impurity which concentration is higher than a concentration of an impurity to be activated as n type is used.

And desirably, a carrier concentration of an area within the $In_xGa_{1-x}As$ graded-composition layer which area is contacted with the $In_xGa_{1-x}As$ contact layer is set higher than a carrier concentration of an area therewithin which area is contacted with the $Al_xGa_{1-x}As$ layer.

Further, preferably, an n type impurity concentration of an area within the $In_xGa_{1-x}As$ graded-composition layer which area is contacted with the $In_xGa_{1-x}As$ contact layer is set higher than an n type impurity concentration of an area therewithin which area is contacted with the $Al_xGa_{1-x}As$ layer.

The inventors of the present application have studied and conducted many tests on the basis of measurement results of carrier concentration distribution in such an $InAs/In_xGa_{1-x}As/GaAs$ structure doped with silicon as shown in FIG. 6, and eventually found the fact that, when the amount of n type impurity doped into the $In_xGa_{1-x}As$ graded-composition layer is set to be remarkably large, a large dip or drop in the carrier concentration within the composition layer can be eliminated.

The present invention is based on this fact.

That is, in accordance with the present invention, the $In_xGa_{1-x}As$ graded-composition layer is doped with an n type impurity which concentration is higher than an n type-activated impurity concentration so that, even when a current is vertically passed through the semiconductor device, a very low contact can be attained.

In this case, when a carrier concentration of an area within the $In_xGa_{1-x}As$ graded-composition layer which area is contacted with the $In_xGa_{1-x}As$ contact layer is set higher than a carrier concentration of an area therewithin which area is contacted with the $Al_xGa_{1-x}As$ layer, the contact resistance can be further reduced.

Further, when an n type impurity concentration of an area within the $In_xGa_{1-x}As$ graded-composition layer which area is contacted with the $In_xGa_{1-x}As$ contact layer is set higher than an n type impurity concentration of an area therewithin which area is contacted with the $Al_xGa_{1-x}As$ layer, the carrier concentration within the graded-composition layer can be increased and the contact resistance can be much more reduced.

From our experimental results, it is desirable that the impurity concentration is set to be above $3 \times 10^{19} cm^{-3}$.

DESCRIPTION OF THE PREFERRED EMBODIMENTS

Figure 1:
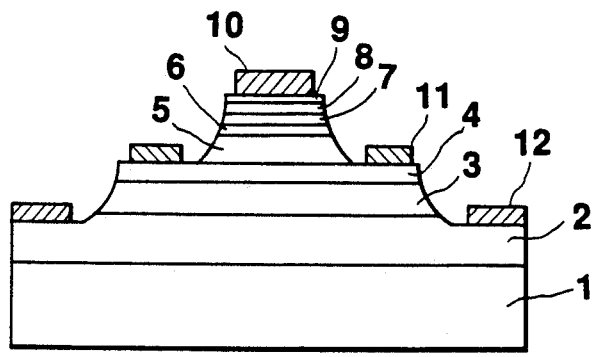
FIG. 1 is a cross-sectional view of a heterojunction bipolar transistor in accordance with a first embodiment of the present invention.

Referring first to FIG. 1, there is shown, in cross section, a heterojunction bipolar transistor which is based on AlGaAs/GaAs heterojunction in accordance with the present invention.

The heterojunction bipolar transistor shown in FIG. 1 includes a collector contact layer 2 formed on a semi-insulating substrate 1, a collector layer 3, which may be formed of an n type GaAs material, formed on collector contact layer 2, a base layer 4, which may be formed of a p type $Al_xGa_{1-x}As$ material where $0 \leq X < 1$, formed on collector layer 3, a constant-composition emitter layer 5, which may be formed of an n type $Al_xGa_{1-x}As$ material where $0 \leq X \leq 1$, formed on base layer 4, and a graded-composition emitter layer 6, which may be formed of an n type $Al_xGa_{1-x}As$ material where $0 \leq X \leq 1$, formed on constant-composition emitter layer 5. An emitter contact formed on graded-composition emitter layer 6 includes an $Al_xGa_{1-x}As$ constant-composition layer 7 where $0 \leq X \leq 1$, an $In_xGa_{1-x}As$ graded-composition layer 8 where $0 \leq X \leq 1$, and an $In_xGa_{1-x}As$ constant-composition contact layer 9 where $0 < X \leq 1$. A metal electrode 10 is formed on an $In_xGa_{1-x}As$ constant-composition contact layer 9.

Specific embodiments of the present invention will be discussed in detail with reference to the attached drawings.

EMBODIMENT 1

Figure 2A:
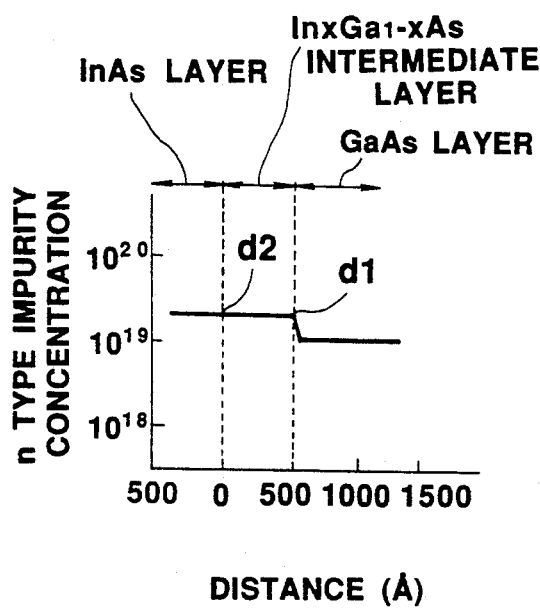
FIG. 2(a) is a graph showing a relationship between n type impurity concentration and depth for respective layers of an emitter contact portion in the transistor of FIG. 1.

The illustrated heterojunction bipolar transistor is characterized in that a contact to an emitter layer made up of an n type $Al_{0.3}Ga_{0.7}As$ layer 5 of 2000 Å thickness and an n type $Al_xGa_{1-x}As$ graded-composition layer ($x = 0.3 \rightarrow 0$) 6 of 300 Å thickness comprises an $n^+$ type GaAs layer 7 of 500 Å thickness, an $n^+$ type $In_xGa_{1-x}As$ graded-composition layer ($x = 0 \rightarrow 1$) 8 of 400 Å thickness and an $n^+$ type InAs layer 9 of 400 Å, and in that the $n^+$ type InAs layer 9 and $n^+$ type $In_xGa_{1-x}As$ layer 8 are set to have both a high impurity concentration of $3.5 \times 10^{19}$ cm$^{-3}$ and an emitter electrode 10 of Cr/Au material is formed on the n+ type InAs layer 9. In this case, the measured impurity concentration of the n+ type In$_x$Ga$_{1-x}$As layer 8 is $3.5 \times 10^{19}$ cm$^{-3}$ as shown in FIG. 2(a). Si is used as the n type impurity and Be is used as the p type impurity.

More specifically, in the heterojunction bipolar transistor, its element region includes an n+ type GaAs layer 2 of 5000 Å thickness formed on a semi-insulating GaAs substrate 1 as a collector contact layer, an n− type GaAs layer 3 of 5000 Å as a low-concentration collector layer, a p+ type GaAs layer 4 of 1000 Å as a base layer, the n type Al$_{0.3}$Ga$_{0.7}$As layer 5 of 2000 Å forming the emitter layer, and the n type Al$_x$Ga$_{1-x}$As graded-composition layer (x=0.3→0) 6 of 300 Å, these layers being sequentially formed in this order. The contact to the emitter layer includes the n+ type GaAs layer 7, the n+ type In$_x$Ga$_{1-x}$As graded-composition layer (x=0→1) 8 and the n+ type InAs layer 9.

The emitter, base and collector electrodes 10, 11 and 12 are provided to the corresponding layers respectively.

The respective semiconductor layers of this heterojunction bipolar transistor are formed on the substrate by one of a number of possible epitaxial growth techniques including a molecular beam epitaxy technique (MBE technique), a gas source molecular beam epitaxy technique (GSMBE technique) and metal organic CVD technique (MOCVD technique). In the illustrated embodiment, the MBE technique is employed.

In the present embodiment, the x in the n+ type In$_x$Ga$_{1-x}$As graded-composition layer (x=0→1) 8 is set to increase from 0 to 1 from its bottom to top, whereby the conduction bands of the n+ type GaAs layer 7 and n+ type InAs layer 9 can be smoothly connected together.

Figure 2B:
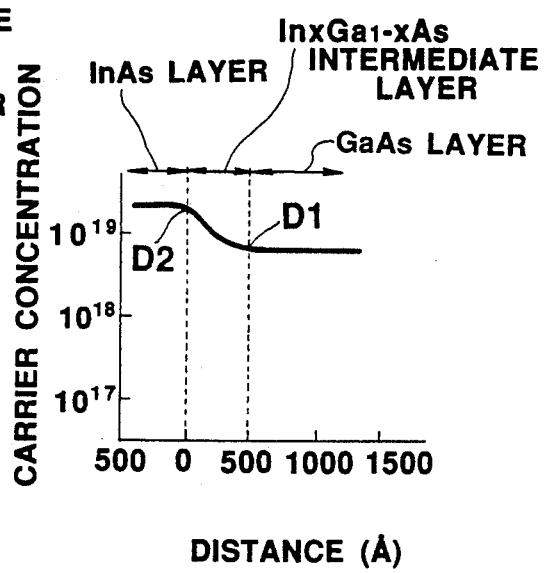
FIG. 2(b) is a graph showing a relationship between carrier concentration and depth for the same layers.

Actually measured results of the carrier concentration for the n+ type GaAs layer 7, n+ type In$_x$Ga$_{1-x}$As intermediate layer or graded-composition layer (x=0→1) 8 as an intermediate layer and n+ type InAs layer 9 in the HBT are shown in FIG. 2(b). As will be observed from the drawing, a dip in the carrier concentration of the n+ type In$_x$Ga$_{1-x}$As intermediate layer is remarkably shallow as compared with that in the prior art.

An emitter contact resistance of the HBT thus obtained was $7 \times 10^{-8} \Omega$cm$^2$, which is very small compared with $5 \times 10^{-6} \Omega$cm$^2$ in the prior art HBT.

In this way, in accordance with the HBT of the present invention, since the emitter resistance can be made very low, its transconductance Gm can be improved over the prior art HBT and therefore the HBT of the present invention can be operated in a high current density zone.

With respect to a cut-off frequency $f_T$ as one of the performance criteria of a transistor, the present invention has a cut-off frequency $f_T$ of 90 GHz that is remarkably improved over 70 GHz of the prior art.

Given below in Table 1 are measurement results of impurity concentration and corresponding contact specific resistance of the HBT having the same structure as above but when only the impurity concentration of the n+ type In$_x$Ga$_{1-x}$As intermediate layer 8 is varied.

TABLE 1

| n type impurity concentration of In$_x$Ga$_{1-x}$As intermediate layer | Contact specific resistances obtained |
|---|---|
| $5 \times 10^{18}$ cm$^{-3}$ | About $8 \times 10^{-6}$ $\Omega$cm$^2$ |

TABLE 1-continued

| n type impurity concentration of In$_x$Ga$_{1-x}$As intermediate layer | Contact specific resistances obtained |
|---|---|
| $1.5 \times 10^{19}$ cm$^{-3}$ | About $5 \times 10^{-6}$ $\Omega$cm$^2$ |
| $3 \times 10^{19}$ cm$^{-3}$ | About $7 \times 10^{-8}$ $\Omega$cm$^2$ |
| $5 \times 10^{19}$ cm$^{-3}$ | About $5 \times 10^{-8}$ $\Omega$cm$^2$ |

In this case, the upper limit of the obtained in type carrier concentrations is about $2 \times 10^{19}$ cm$^{-3}$ but as will be seen from the above Table 1, when the impurity concentration of the n+ type In$_x$Ga$_{1-x}$As intermediate layer 8 is set to be above $3 \times 10^{19}$ cm$^{-3}$, a very low contact resistance can be obtained.

EMBODIMENT 2

Explanation will next be made as to an HBT of a second embodiment of the present invention, which has the same structure as the HBT of the embodiment 1 of FIG. 1 and wherein the impurity concentration of the n+ type In$_x$Ga$_{1-x}$As graded-composition layer 8 is varied therein.

Figure 3A:
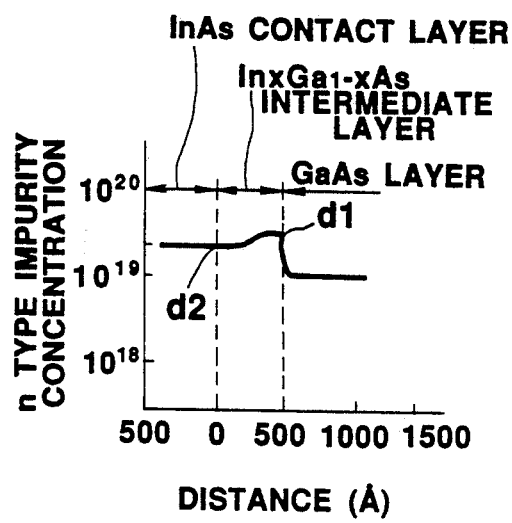
FIG. 3(a) is a graph showing a relationship between n type impurity concentration and depth for respective layers of an emitter contact portion in a transistor in accordance with a second embodiment of the present invention.

More in detail, in the HBT of the embodiment 2, the n type impurity concentration of the n+ type In$_x$Ga$_{1-x}$As graded-composition layer 8 is set to gradually decrease from its side of the n+ type GaAs layer 7 to the side of the n+ type InAs layer 9, as shown in FIG. 3(a). In other words, the HBT of the present embodiment 2 is arranged so that the n type impurity concentration of the n+ type In$_x$Ga$_{1-x}$As graded-composition layer 8 is gradually decreased from its n+ type GaAs layer 7 side to its n+ type InAs layer 9 side as shown in FIG. 3(a). That is, the n type impurity concentration d1 of the area of the n+ type In$_x$Ga$_{1-x}$As graded-composition layer 8 contacted with the GaAs layer 7 is set higher than the n type impurity concentration d2 of that area of the layer 8 contacted with the n+ type InAs layer 9. In the present embodiment, the n type impurity concentration d2 of the layer 8 contacted with the InAs contact layer 9 was set at $3.5 \times 10^{19}$ cm$^{-3}$ while the n type impurity concentration d1 of the area contacted with the GaAs layer 7 is set at $4.0 \times 10^{19}$ cm$^{-3}$.

Figure 3B:
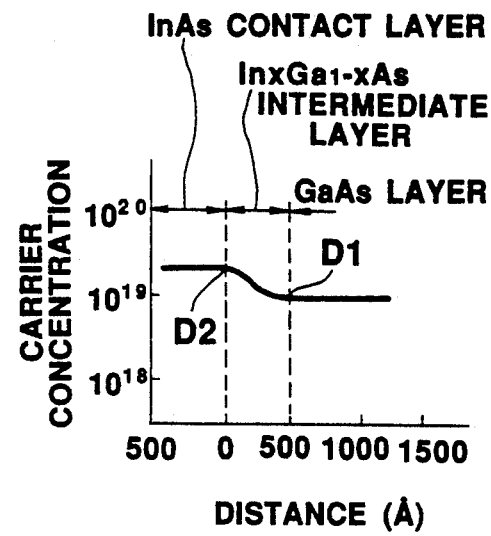
FIG. 3(b) is a graph showing a relationship between carrier concentration and depth for the layers in the same transistor.

FIG. 3(b) shows measured results of the carrier concentrations for the n+ type GaAs layer 7, n+ type In$_x$Ga$_{1-x}$As intermediate or graded-composition layer (x=0→1) 8 and n+ type InAs layer 9 of the HBT. It will be appreciated from the drawing that any appreciable dip in the carrier concentration is not present within the n+ type In$_x$Ga$_{1-x}$As intermediate layer 8 and the carrier concentration D2 of that area of the n+ type In$_x$Ga$_{1-x}$As graded-composition layer 8 which is contacted with the InAs contact layer 9 is higher than the carrier concentration D1 of that area of the layer 8 contacted with the GaAs layer.

The emitter contact resistance of the thus obtained HBT was $5 \times 10^{-8} \Omega$cm$^2$, which was smaller than the emitter contact resistance of the HBT of the embodiment 1 and that was much smaller than $5 \times 10^{-6} \Omega$cm$^2$ in the prior art HBT.

In this way, in the case of the HBT of the embodiment 2, since the emitter resistance can be made very small, the transconductance Gm can be further improved and the HBT can be operated in a higher current density zone.

With regard to the cut-off frequency $f_T$ as one of the performance indexes of a transistor, the HBT has a cut-off frequency $f_T$ of 100 GHz that is much improved over that of the HBT of the embodiment 1.

Given below in Table 2 are measurement results of impurity concentration and corresponding contact specific resistance of the HBT having the same structure as above but when only the impurity concentration of the n+ type $In_xGa_{1-x}As$ intermediate layer 8 is varied.

TABLE 2

| n type impurity concentration of $In_xGa_{1-x}As$ intermediate layer | Contact specific resistances obtained |
|---|---|
| d1: $7 \times 10^{18}$ cm$^{-3}$<br>d2: $5 \times 10^{18}$ cm$^{-3}$ | About $7 \times 10^{-6}$ $\Omega$cm$^2$ |
| d1: $2 \times 10^{19}$ cm$^{-3}$<br>d2: $1 \times 10^{19}$ cm$^{-3}$ | About $5 \times 10^{-6}$ $\Omega$cm$^2$ |
| d1: $5 \times 10^{19}$ cm$^{-3}$<br>d2: $3 \times 10^{19}$ cm$^{-3}$ | About $7 \times 10^{-8}$ $\Omega$cm$^2$ |
| d1: $7 \times 10^{19}$ cm$^{-3}$<br>d2: $5 \times 10^{19}$ cm$^{-3}$ | About $3 \times 10^{-8}$ $\Omega$cm$^2$ |

In this case, the upper limit of the obtained n type carrier concentrations is about $2 \times 10^{19}$cm$^{-3}$ but as will be seen from the above Table 2, when the impurity concentration of the n+ type $In_xGa_{1-x}As$ intermediate layer 8 is set to be above $3 \times 10^{19}$cm$^{-3}$, a very low contact resistance can be obtained.

EMBODIMENT 3

Figure 4A:
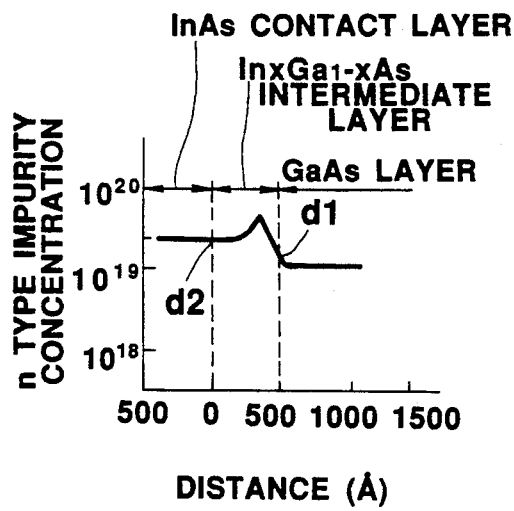
FIG. 4(a) is a graph showing a relationship between n type impurity concentration and depth for respective layers of an emitter contact portion in a transistor in accordance with a third embodiment of the present invention.
Figure 4B:
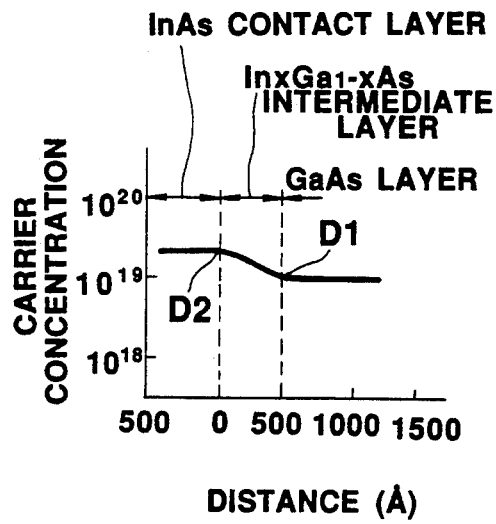
FIG. 4(b) is a graph showing a relationship between carrier concentration and depth for the layers in the same transistor.
Figure 5:
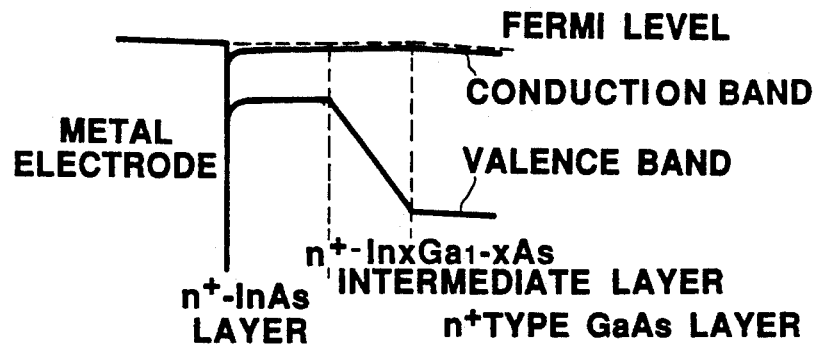
FIG. 5 shows an ideal energy band for a structure of an n type GaAs layer, $n^+$ type $In_xGa_{1-x}As$ layer and an InAs electrode.
Figure 6:
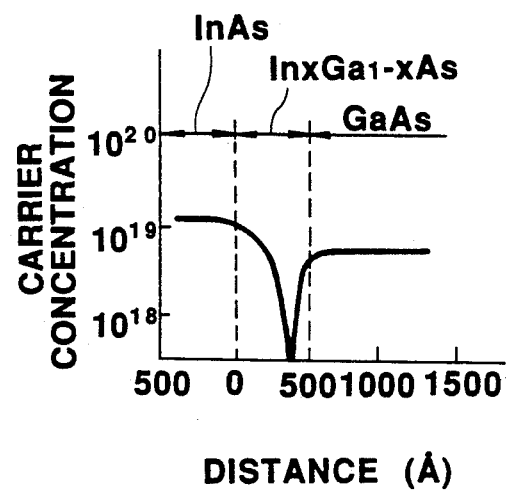
FIG. 6 is a graph showing a relationship between carrier concentration and depth for respective layers of a conventional n type GaAs/$n^+$ type $In_xGa_{1-x}As$/InAs electrode structure doped with silicon.

In the HBT of the foregoing embodiment 2, the impurity concentration of the n+ type $In_xGa_{1-x}As$ graded-composition layer 8 has been set to be gradually decreased from its GaAs layer 7 side to its InAs contact layer 9 side. In the present embodiment 3, as shown in FIG. 4(a), the n type impurity concentration of the n+ type $In_xGa_{1-x}As$ graded-composition layer 8 is set to have a high level in an area within the layer 8 located apart from that area of the layer 8 contacted with the InAs contact layer 9 by a short distance, and to be gradually decreased from the high-level area to that area of the layer 8 contacted with the GaAs layer 7. FIG. 4(b) shows measured results of the carrier concentrations for the n+ type GaAs layer 7, n+ type $In_xGa_{1-x}As$ intermediate or graded-composition layer (x=0→1) 8 and n+ type InAs layer 9 of the HBT. It will be observed from the drawing that any appreciable dip in the carrier concentration is not present within the n+ type $In_xGa_{1-x}As$ intermediate layer 8 and the carrier concentration D2 of that area of the n+ type $In_xGa_{1-x}As$ graded-composition layer 8 which is contacted with the InAs contact layer 9 is higher than the carrier concentration D1 of that area of the layer 8 contacted with the GaAs layer. And the emitter contact resistance of the thus obtained HBT was $4 \times 10^{-8}\Omega$cm$^2$ that was much smaller than the emitter contact resistances of the HBTs of the foregoing embodiments.

The impurity concentration and thickness of the respective semiconductor layers in the HBT are not limited to the particular values used in the foregoing embodiments and may be modified as necessary.

In addition, the present invention may be modified in various ways within the sprit and scope of the attached claims.

What is claimed is:

1. A compound semiconductor device having a contact structure comprising:

an n type $Al_xGa_{1-x}As$ layer ($0 \leq X \leq 1$);

an $In_xGa_{1-x}As$ ($0 \leq X \leq 1$) graded-composition layer formed on the n type $Al_xGa_{1-x}As$ layer and having a gradually varied composition;

an $In_xGa_{1-x}As$ ($0 < X \leq 1$) contact layer having a constant composition formed on the $In_xGa_{1-x}As$ graded-composition layer; and a metal electrode layer connected with the $In_xGa_{1-x}As$ contact layer, wherein an n type impurity concentration within said $In_xGa_{1-x}As$ graded-composition layer gradually decreases from a surface adjacent said $Al_xGa_{1-x}As$ layer to a surface adjacent said $In_xGa_{1-x}As$ contact layer.

2. A compound semiconductor device having a contact structure comprising:

an n type $Al_xGa_{1-x}As$ layer ($0 \leq X \leq 1$);

an $In_xGa_{1-x}As$ ($0 \leq X \leq 1$) graded-composition layer formed on the n type $Al_xGa_{1-x}As$ layer and having a gradually varied composition;

an $In_xGa_{1-x}As$ ($0 \leq X \leq 1$) contact layer having a constant composition formed on the $In_xGa_{1-x}As$ graded-composition layer; and a metal electrode layer connected with the $In_xGa_{1-x}As$ contact layer, wherein an n type impurity concentration of said $In_xGa_{1-x}As$ graded-composition layer has a maximum level in an area within the $In_xGa_{1-x}As$ graded-composition layer which is located a relatively short distance apart from an area of the $In_xGa_{1-x}As$ graded-composition layer which is in contact with the $In_xGa_{1-x}As$ contact layer, the n type impurity concentration gradually decreases from the areas of the maximum level to an area of the $In_xGa_{1-x}As$ graded-composition layer which is in contact with said $Al_xGa_{1-x}As$ layer.

3. An npn type heterojunction bipolar transistor comprising:

a collector layer of an n type GaAs material;

a base layer of a p type $Al_xGa_{1-x}As$ material ($0 \leq X < 1$);

an emitter layer of an n type $Al_xGa_{1-x}As$ material ($0 \leq X < 1$);

an emitter contact including:

an $In_xGa_{1-x}As$ ($0 \leq X \leq 1$) graded-composition layer formed on the emitter layer and having a gradually varied composition, an $In_xGa_{1-x}As$ ($0 < X \leq 1$) contact layer having a constant composition formed on the $In_xGa_{1-x}As$ graded-composition layer, and a metal electrode layer connected to the $In_xGa_{1-x}As$ contact layer, wherein an n type impurity concentration within said $In_xGa_{1-x}As$ graded-composition layer gradually decreases from a surface adjacent said emitter layer to a surface adjacent said $In_xGa_{1-x}As$ contact layer.

4. An npn type heterojunction bipolar transistor comprising:

a collector layer of an n type GaAs material;

a base layer of a p type $Al_xGa_{1-x}As$ material ($0 \leq X < 1$);

an emitter layer of an n type $Al_xGa_{1-x}As$ material ($0 \leq X \leq 1$);

an emitter contact including:

an $In_xGa_{1-x}As$ ($0 \leq X \leq 1$) graded-composition layer formed on the emitter layer and having a gradually varied composition, an $In_xGa_{1-x}As$ ($0 < X \leq 1$) contact layer having a constant composition formed on the $In_xGa_{1-x}As$ graded-composition layer, and a metal electrode layer connected to the $In_xGa_{1-x}As$ contact layer, wherein an n type impurity concentration of said $In_xGa_{1-x}As$ graded-composition layer has a maximum level in an area within the $In_xGa_{1-x}As$ graded-composition layer which is located a relatively short distance apart from an area of the $In_xGa_{1-x}As$ graded-composition layer which is in contact with the $In_xGa_{1-x}As$ contact layer, the n type impurity concentration gradually decreases from the area of the maximum level to an area of the $In_xGa_{1-x}As$ graded-composition layer which is in contact with said emitter layer.

5. A compound semiconductor device as set forth in claim 1, wherein an area within said $In_xGa_{1-x}As$ graded-composition layer which is in contact with said $In_xGa_{1-x}As$ contact layer has a carrier concentration which is higher than a carrier concentration of an area within said $In_xGa_{1-x}As$ graded-composition layer which is in contact with said $Al_xGa_{1-x}As$ layer.

6. A compound semiconductor device as set forth in claim 2, wherein an area within said $In_xGa_{1-x}As$ graded-composition layer which is in contact with said $In_xGa_{1-x}As$ contact layer has a carrier concentration which is higher than a carrier concentration of an area within said $In_xGa_{1-x}As$ graded-composition layer which is in contact with said $Al_xGa_{1-x}As$ layer.

7. An npn type heterojunction bipolar transistor as set forth in claim 3, wherein an area within said $In_xGa_{1-x}As$ graded-composition layer which is in contact with said $In_xGa_{1-x}As$ contact layer has a carrier concentration which is higher than a carrier concentration of an area within said $In_xGa_{1-x}As$ graded-composition layer which is in contact with said emitter layer.

8. An npn type heterojunction bipolar transistor as set forth in claim 4, wherein an area within said $In_xGa_{1-x}As$ graded-composition layer which is in contact with said $In_xGa_{1-x}As$ contact layer has a carrier concentration which is higher than a carrier concentration of an area within said $In_xGa_{1-x}As$ graded-composition layer which is in contact with said emitter layer.

* * * * *